United States Patent
Shinohara (10) Patent No.: US 7,155,360 B2
(45) Date of Patent: *Dec. 26, 2006

(54) PROCESS VARIATION DETECTOR AND PROCESS VARIATION DETECTING METHOD

(75) Inventor: Kensuke Shinohara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

This patent is subject to a terminal disclaimer.

(21) Appl. No.: 10/995,341

(22) Filed: Nov. 24, 2004

(65) Prior Publication Data

US 2006/0025954 A1 Feb. 2, 2006

(30) Foreign Application Priority Data

Jul. 27, 2004 (JP) .............................. 2004-219233

(51) Int. Cl.
*G06F 19/00* (2006.01)
(52) U.S. Cl. ...................... 702/117; 702/123; 702/182; 702/189; 326/15; 326/36; 700/21; 324/719; 340/825.69; 340/825.72; 340/442; 340/447; 438/17; 438/907; 438/980
(58) Field of Classification Search ................ 702/117, 702/123, 182, 189; 326/15, 35–36, 63; 700/21; 324/719; 340/825.69, 825.72, 442, 447; 438/17, 907, 963, 980
See application file for complete search history.

(56) References Cited

U.S. PATENT DOCUMENTS 5,427,878 A * 6/1995 Corliss ........................ 430/30
5,903,012 A * 5/1999 Boerstler .................... 257/48
6,239,627 B1 * 5/2001 Brown et al. .............. 327/116

FOREIGN PATENT DOCUMENTS

| JP | 6-110575 | 4/1994 |
|---|---|---|
| JP | 7-202131 | 8/1995 |
| JP | 2000-201058 | 7/2000 |
| JP | 2003-017573 | 1/2003 |
| JP | 2003-109379 | 4/2003 |

OTHER PUBLICATIONS

Patel et al., 'A process and Technology-Tolerant IDDq Method for IC Diagnosis', Jan. 2000, University of Maryland Publication, pp. 1-6.*
Russell et al., 'Determination of Spatial Variation of Interface Trapped Charge Using Short-Channel Mosfet's', Jun. 9, 1983, IEEE Publication, pp. 1662-1671.*
Xu et al., 'IC -Integrated Flexible Shear-Stress Sensor Skin', Jun. 2002, SSSAM Workshop, pp. 354-357.*
Plusquellic et al., 'Digital IC Device Testing by Transient Signal Analysis (TSA)', Jan. 17, 1996, University of Pittsburg, pp. 1-8.*

* cited by examiner

*Primary Examiner*—Carol S. W. Tsai
*Assistant Examiner*—Elias Desta
(74) *Attorney, Agent, or Firm*—Staas & Halsey LLP (57) ABSTRACT

A process variation detector includes a pulse-signal generating unit that generates a pulse signal having a pulse width corresponding to a characteristic of a process variation in an integrated circuit based on a clock signal; and an output unit that generates a predetermined value, when the pulse signal indicates a specific process variation, by using a transistor of which a channel width and a gate length are set to an unbalanced state, and outputs the predetermined value.

17 Claims, 11 Drawing Sheets

|  | PULSE WIDTH IN EACH PROCESS STATE | | |
|---|---|---|---|
|  | TT,FS,SF | FF | SS |
| CLP | NORMAL | SMALL | LARGE |
| CLPX | NORMAL | SMALL | LARGE |
| CLP1 | NORMAL | LARGE | SMALL |
| CLPX1 | NORMAL | LARGE | SMALL |

PROCESS VARIATION DETECTOR AND PROCESS VARIATION DETECTING METHOD

BACKGROUND OF THE INVENTION

1) Field of the Invention

The present invention relates to a process variation detector and a process variation detecting method that detect a process variation included in an integrated circuit.

2) Description of the Related Art

A semiconductor integrated circuit (hereinafter, simply, "chip") such as an integrated circuit (IC) and a large scale integration (LSI) is manufactured by repeating many times a process of adding impurities to a silicon wafer and forming an insulation film, a wiring metal film, and the like.

However, when chips are manufactured from a silicon wafer, problems occur that there is a process variation between the manufactured chips and that the chips do not operate normally. Therefore, conventionally, in order to tune the macro circuit within each chip, a tuning circuit is built into each macro circuit by assuming a process variation in advance. At present, a process variation within the chips becomes noticeable along the progress of micro fabrication of a semiconductor device.

After the chips are manufactured, the chips are tested manually, an optimum clock tuning signal is determined, and the determined clock turning signal is input to each macro circuit. With this arrangement, the chips can operate normally even if there is a process variation within the chips.

Japanese Patent Application Lid-Open No. 2003-109379 discloses a technique of generating a timing signal by comparing a potential of a dummy bit line with a reference voltage, thereby improving an operation margin and enabling high-speed operation of the chips.

The conventional technique, however, has problems in that it is not possible to quickly detect a state of a process variation and that each macro circuit included in the chips cannot be tuned efficiently.

Specifically, in specifying a clock tuning signal to be input to a tuning circuit, the chips need to be manufactured and further need to be tested manually. Therefore, this process requires tremendous amounts of time and cost, and places a large load on users who carry out the test.

According to the conventional technique, a common clock tuning signal is used for the same kind of macro circuits. Therefore, a tuning signal cannot be set for each macro circuit of each chip.

SUMMARY OF THE INVENTION

It is an object of the present invention to solve at least the above problems in the conventional technology.

A process variation detector according to one aspect of the present invention detects process variation in an integrated circuit, and includes a pulse-signal generating unit that generates a pulse signal having a pulse width corresponding to a characteristic of a process variation in an integrated circuit based on a clock signal; and an output unit that generates a predetermined value, when the pulse signal indicates a specific process variation, by using a transistor of which a channel width and a gate length are set to an unbalanced state, and outputs the predetermined value.

A method for detecting process variation in a semiconductor integrated circuit according to another aspect of the present invention includes generating a pulse signal having a pulse width corresponding to a characteristic of a process variation in a semiconductor integrated circuit based on a clock signal; generating a predetermined value, when the pulse signal indicates a specific process variation, by using a transistor of which a channel width and a gate length are set to an unbalanced state; and outputting the predetermined value.

The other objects, features, and advantages of the present invention are specifically set forth in or will become apparent from the following detailed description of the invention when read in conjunction with the accompanying drawings.

DETAILED DESCRIPTION

Exemplary embodiments a process variation detector according to the present invention will be explained in detail with reference to the accompanying drawings.

Figure 1:
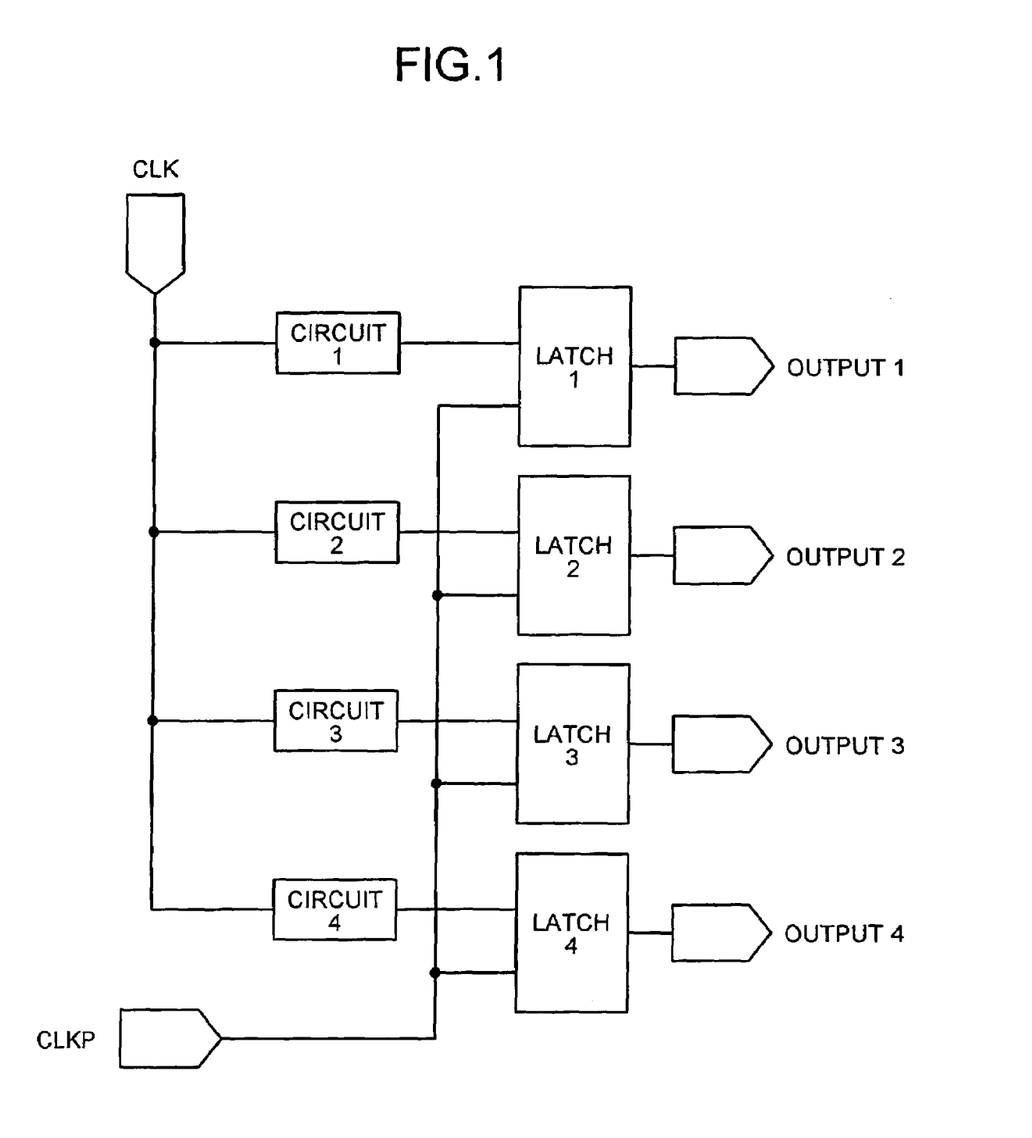
FIG. 1 is an explanatory diagram of a concept of process variation detection according to the present embodiment.

A concept of process variation detection according to the present embodiment is explained first. FIG. 1 is an explanatory diagram of the concept of the process variation detection according to the present embodiment. As shown in the diagram, a clock signal CLK is input to circuits 1 to 4, and the circuits 1 to 4 are connected to latches 1 to 4. The latches 1 to 4 are connected to a chop pulse signal CLKP.

The circuits 1 to 4 are configured to disable the latches 1 to 4 to read correct outputs when a specific process variation occurs. The process variation is a variation of an actual response speed from an ideal response speed when a pmos (P-channel metal oxide semiconductor) and an nmos (N-channel metal oxide semiconductor), which constitute a transistor or the like included in a chip, are connected to a voltage.

According to the present embodiment, five kinds of states are set: a response speed of the pmos being fast (i.e., faster than the ideal response speed), and a response speed of the nmos being slow (i.e., slower than the ideal response speed) (an FS state); a response speed of the pmos being slow, and a response speed of the nmos being fast (an SF state); a response speed of the pmos being fast, and a response speed of the nmos being fast (an FF state); a response speed of the pmos being slow, and a response speed of the nmos being slow (an SS state); and a response speed of the pmos and a response speed of the nmos being ideal (a TT state).

The circuit 1 inputs H data (hereinafter, "H") to the latch 1 in only the FS state, the circuit 2 inputs H to the latch 2 in only the SF state, the circuit 3 inputs H to the latch 3 in only the FF state, and the circuit 4 inputs H to the latch 4 in only the SS state.

The latches 1 to 4 read data triggered by the chop pulse signal CLKP. A state of a process variation can be understood by referring to an output value. Specifically, when H is output from only an output 1, a process variation is in the FS state. When H is output from only an output 2, a process variation is in the SF state. When H is output from only an output 3, a process variation is in the FF state. When H is output from only an output 4, a process variation is in the SS state. When H is not output from any one of the outputs 1 to 4, a process variation is in the TT state. When the values output from the outputs 1 to 4 are used as clock tuning signals (CT), process variations are coped with automatically.

Figure 2:
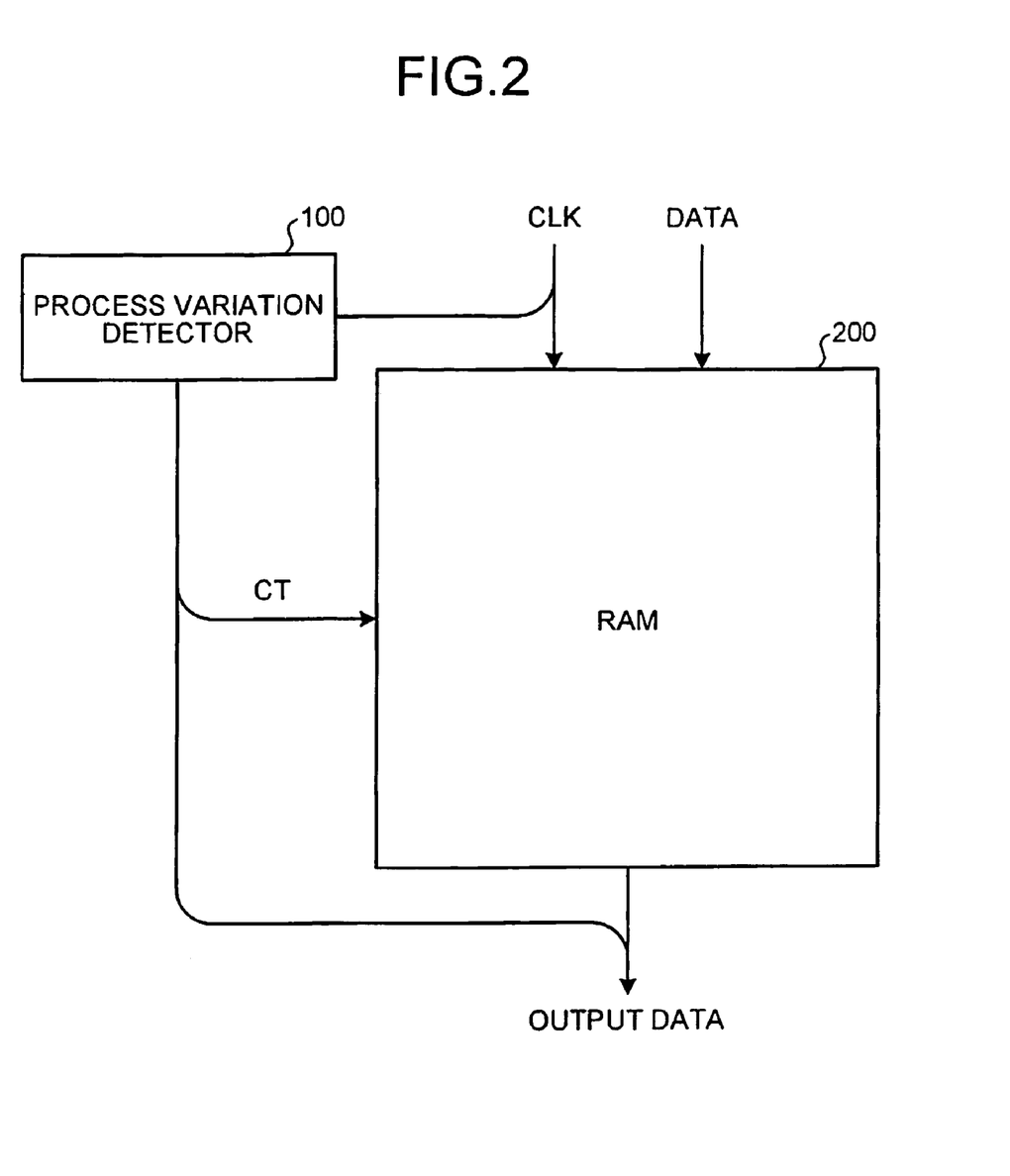
FIG. 2 is a connection example of a process variation detector according to the present embodiment.

FIG. 2 is a connection example of a process variation detector 100 according to the present embodiment. As shown in FIG. 2, the process variation detector 100 is connected to a random access memory (RAM) 200 that has a tuning circuit, and inputs a clock tuning signal corresponding to a process variation to the RAM 200. FIG. 2 is just an example, and the process variation detector 100 can be used for any macro circuit that has a tuning circuit.

Since the process variation detector 100 according to the present embodiment can be set to each macro circuit, a clock tuning signal that is optimum for each macro can be generated to deal with a process variation.

Figure 3:
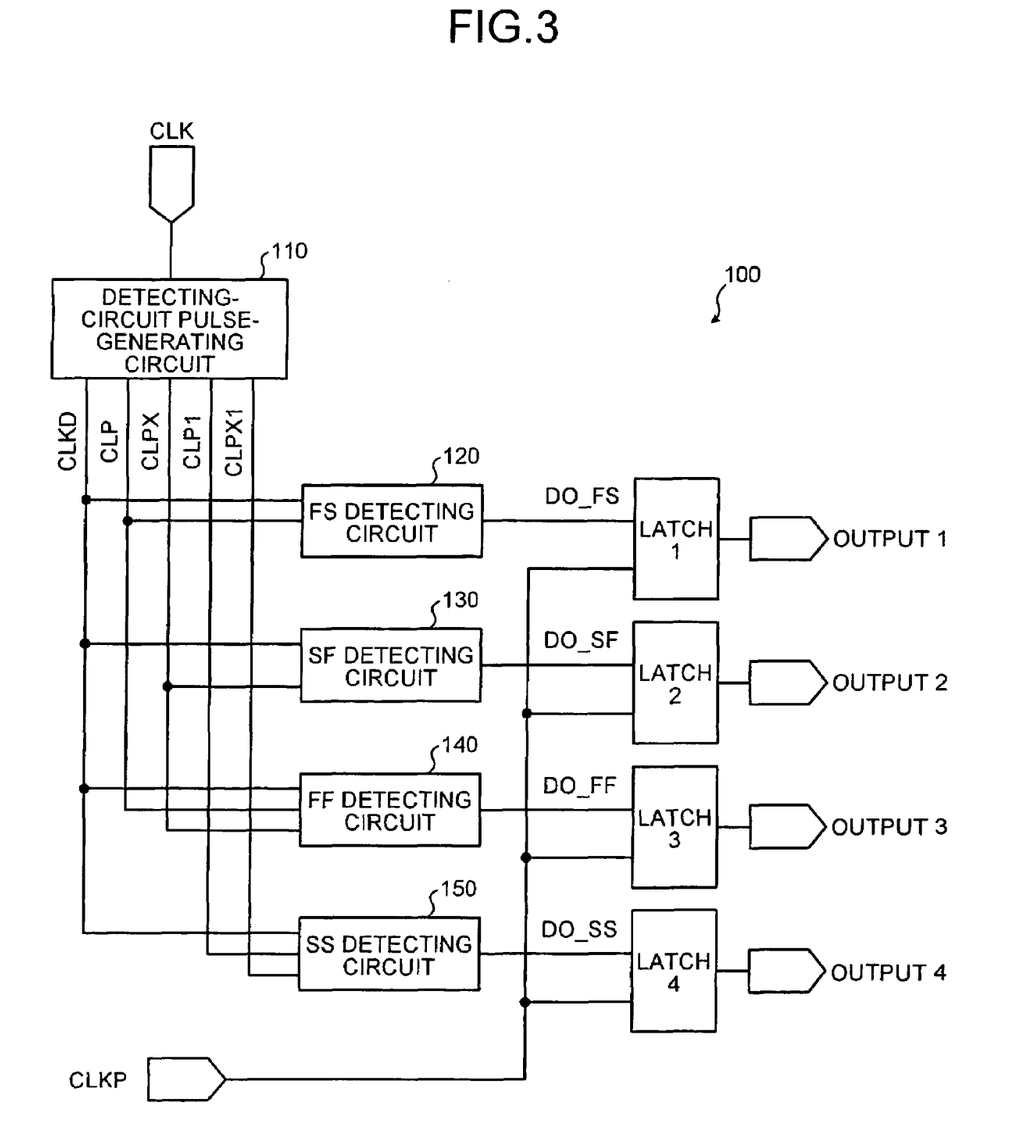
FIG. 3 is a block diagram of a configuration of the process variation detector according to the present embodiment.

A configuration of the process variation detector 100 according to the present embodiment is explained next. FIG. 3 is a block diagram of the configuration of the process variation detector 100 according to the present embodiment. As shown in the diagram, the process variation detector 100 has a detecting-circuit pulse-generating circuit 110, an FS detecting circuit 120, an SF detecting circuit 130, an FF detecting circuit 140, an SS detecting circuit 150, and the latches 1 to 4.

The detecting-circuit pulse-generating circuit 110 generates signals of different pulse widths corresponding to the states of process variation, and inputs the generated signals to the FS detecting circuit 120, the SF detecting circuit 130, the FF detecting circuit 140, and the SS detecting circuit 150.

Figure 4:
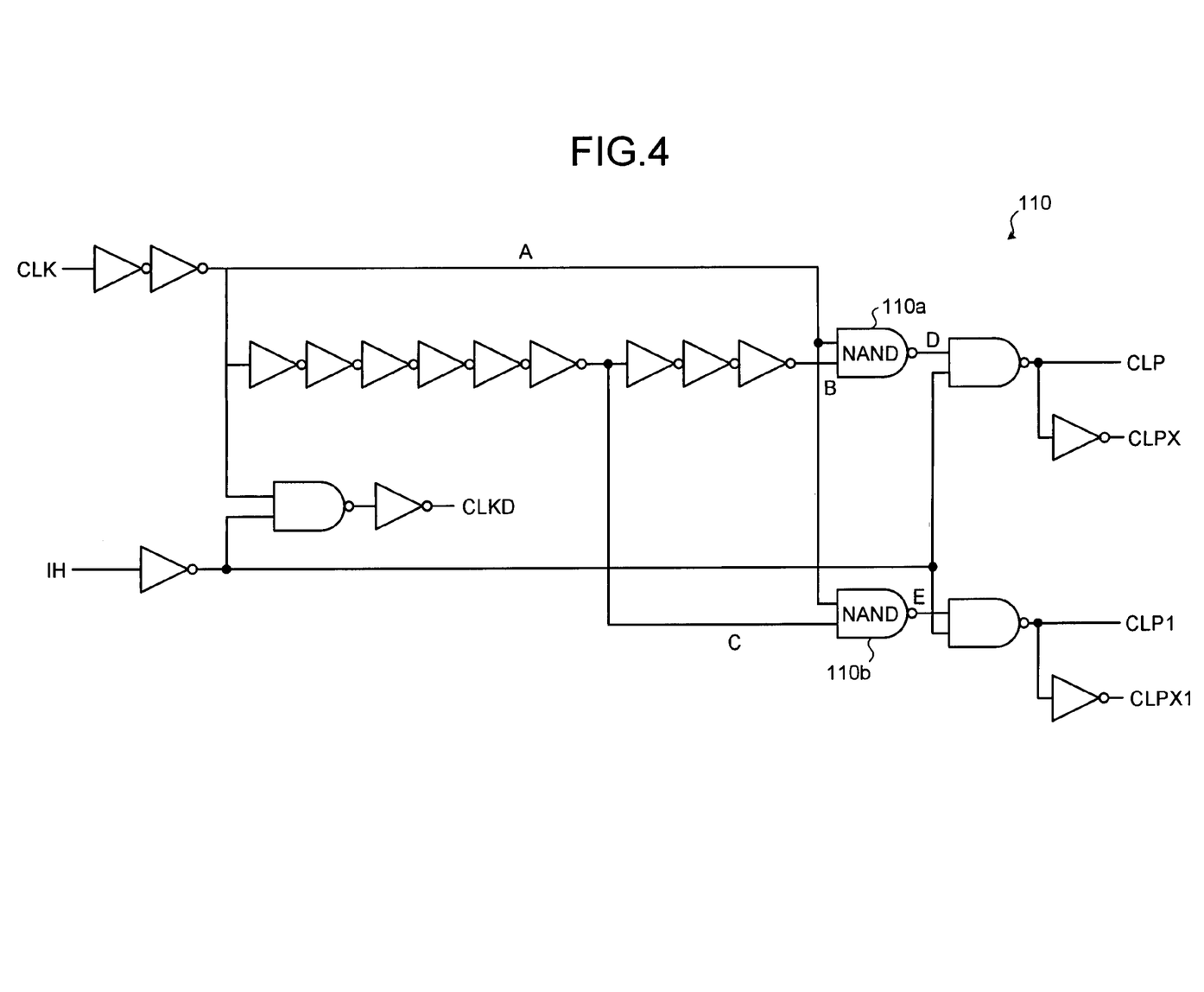
FIG. 4 is a configuration diagram of a detecting-circuit pulse generating circuit.

A configuration of the detecting-circuit pulse-generating circuit 110 is explained next. FIG. 4 is a configuration diagram of the detecting-circuit pulse-generating circuit 110. As shown in this diagram, the detecting-circuit pulse-generating circuit 110 includes a plurality of inverters (i.e., NOT operators) and NAND operators.

The clock signal CLK and an IH signal are input to the detecting-circuit pulse-generating circuit 110. The IH signal is used to suppress the clock signal CLK. When the IH signal is H, the IH signal causes the detecting circuits 120 to 150 to read L data (hereinafter, "L") thereby initializing the detecting circuits 120 to 150.

The detecting-circuit pulse-generating circuit 110 outputs a signal CLKD obtained by delaying the clock signal CLK, a signal CLP to be used in the FS detecting circuit 120 and the FF detecting circuit 140, a signal CLPX to be used in the SF detecting circuit 130 and the FF detecting circuit 140, and signals CLP1 and CLPX1 to be used in the SS detecting circuit 150, respectively.

A waveform of each node concerning a state of each process variation is explained next. A waveform of a node A (hereinafter, "waveform A") that the clock signal CLK in each process state passes two stages of inverters, a waveform of a node B (hereinafter, "waveform B") that the clock signal CLK passes nine stages of inverters, and a waveform of a node D (hereinafter, "waveform D") that the clock signal CLK passes a NAND operator 110a are shown in FIG. 5.

Figure 5:
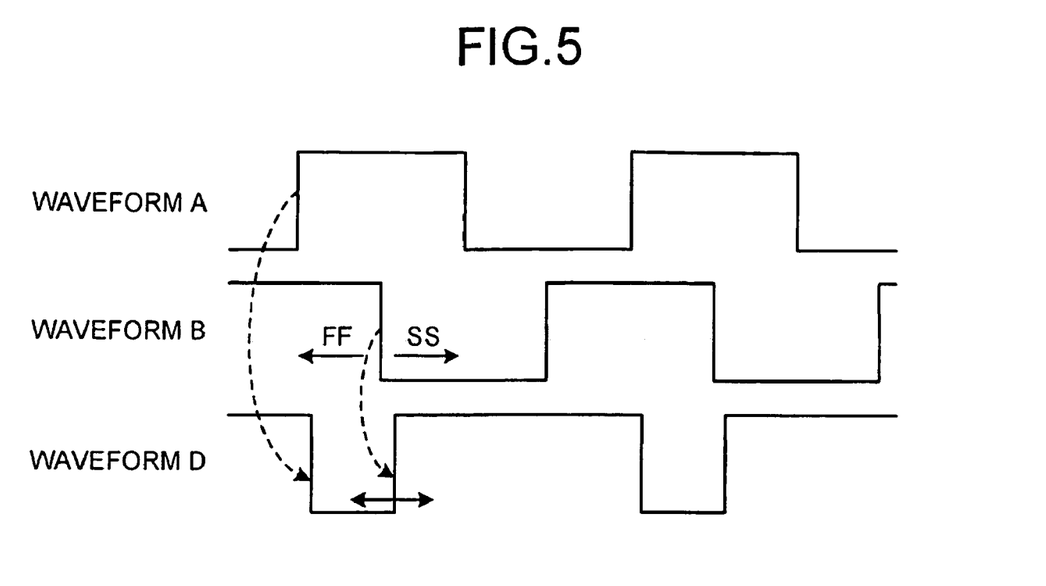
FIG. 5 is an explanatory diagram of a waveform A, a waveform B, and a waveform D concerning process states.

As shown in FIG. 5, when a process variation is in the FF state, the waveform B is generated faster than usual because a response speed (i.e., a switching speed) of the pmos and the nmos is fast. Therefore, a section of Low (hereinafter, "L section") concerning the waveform D has a small width.

On the other hand, when a process variation is in the SS state, the waveform B is generated later than usual because a response speed of the pmos and the nmos is slow. Therefore, the L section concerning the waveform D has a large width. When a process variation is in the TT, FS, and SF states, the L section concerning the waveform D has a normal width because the waveform B is normal.

Figure 6:
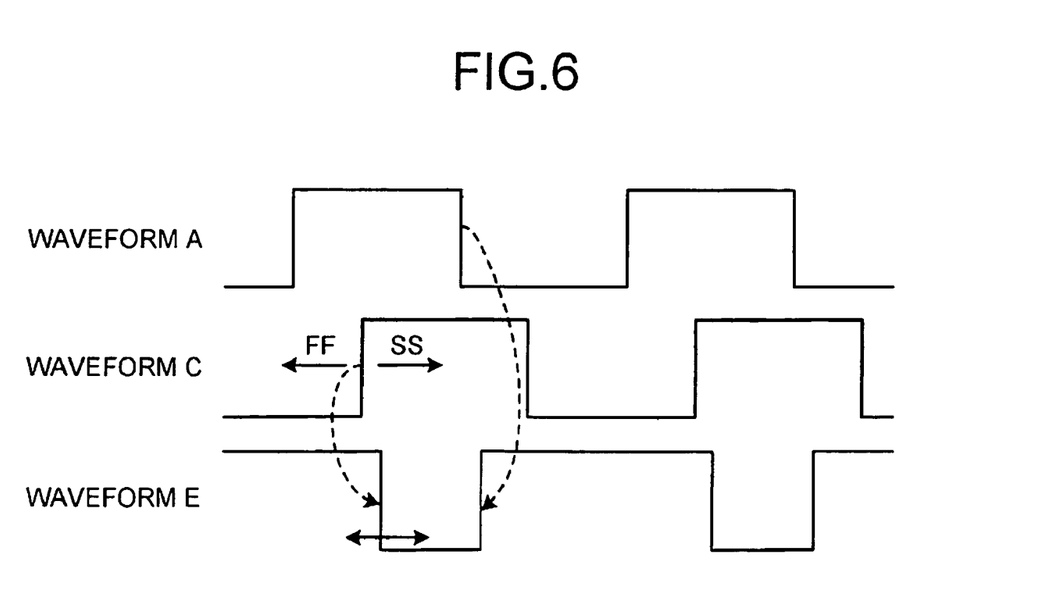
FIG. 6 is an explanatory diagram of the waveform A, a waveform C, and a waveform E concerning process states.

The waveform A in each process state, a waveform of a node C (hereinafter, "waveform C") that is generated by delaying the clock signal at six stages of inverters, and a waveform of a node E (hereinafter, "waveform E") that the clock signal passes a NAND operator 110b are shown in FIG. 6.

As shown in FIG. 6, when a process variation is in the FF state, the waveform C is generated faster than usual because the response speed of the pmos and the nmos is fast. Therefore, the L section concerning the waveform E has a large width.

On the other hand, when a process variation is in the SS state, the waveform C is generated later than usual because the response speed of the pmos and the nmos is slow. Therefore, the L section concerning the waveform E has a small width. When a process variation is in the TT, FS, and SF states, the L section concerning the waveform D has a normal width because the waveform C is normal.

Consequently, the CLP becomes a signal having the waveform D inverted, and the CLPX becomes a signal having the waveform D inverted twice (i.e., a signal substantially the same as the signal having the waveform D). The CLP1 becomes a signal having the waveform E inverted, and the CLPX1 becomes a signal having the waveform E inverted twice (i.e., a signal substantially the same as the signal having the waveform E).

Figure 7:
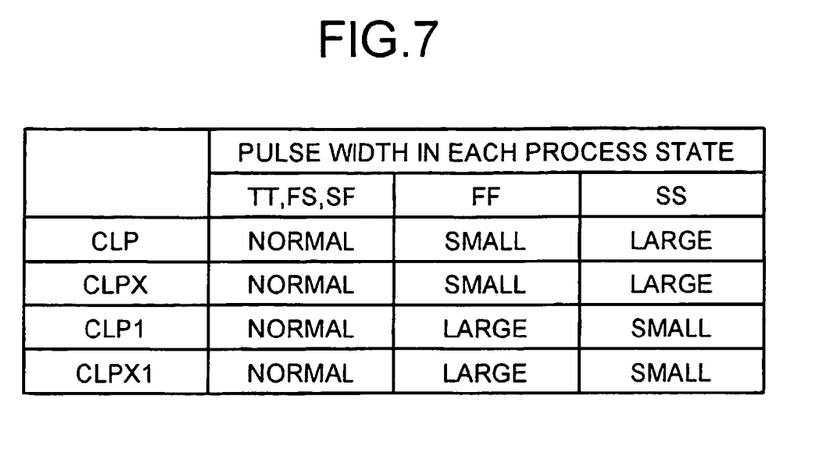
FIG. 7 depicts a relation between a CLP, a CLPX, a CLP1, and a CLPX1, and pulse widths in the process states.

FIG. 7 depicts a relation between the CLP, the CLPX, the CLP1, and the CLPX1, and pulse widths in the process states. As shown in the diagram, in the TT, FS, and SF states, the CLP has a normal width of an H section. In the FF state, the CLP has a small width of the H section. In the SS state, the CLP has a large width of the H section.

In the TT, FS, and SF states, the CLPX has a normal width of the L section. In the FF state, the CLPX has a small width of the L section. In the SS state, the CLPX has a large width of the L section. In the TT, FS, and SF states, the CLP1 has a normal width of the H section. In the FF state, the CLP1 has a large width of the H section. In the SS state, the CLP1 has a small width of the H section. In the TT, FS, and SF states, the CLPX1 has a normal width of the L section. In the FF state, the CLPX1 has a large width of the L section. In the SS state, the CLPX1 has a small width of the L section.

The detecting circuits 120 to 150 are explained next. Among the detecting circuits, the FS detecting circuit 120 is explained first. The FS detecting circuit 120 receives the CLKD and the CLP from the detecting-circuit pulse-generating circuit 110, and outputs 1 to the latch 1 only when the process variation is in the FS state.

Figure 8:
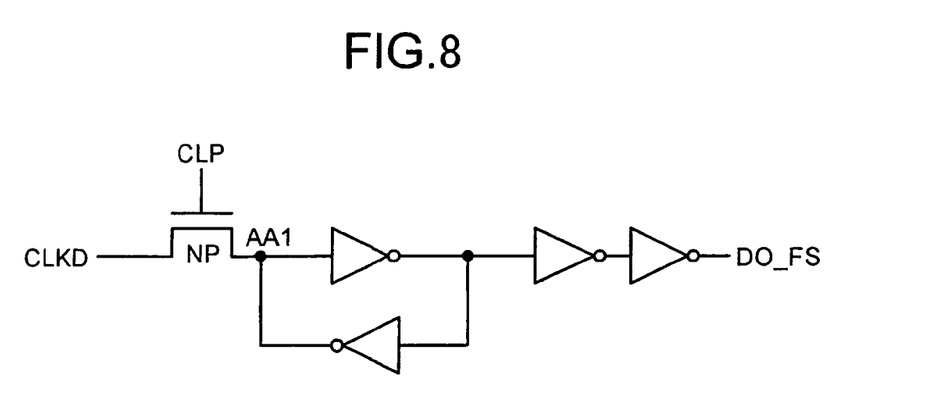
FIG. 8 is one example of a configuration of an FS detecting circuit.
Figure 9:
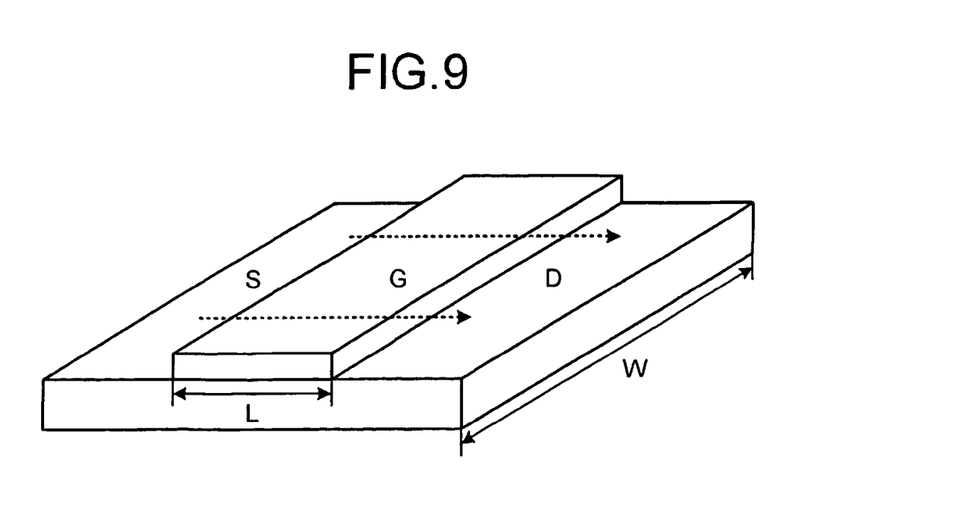
FIG. 9 is a schematic diagram of a transistor.

FIG. 8 is one example of a configuration of the FS detecting circuit 120. As shown in this diagram, the FS detecting circuit 120 has a pass transistor NP of the nmos, and a plurality of inverters. FIG. 9 is a schematic diagram of the transistor.

As shown in FIG. 9, when a voltage is applied to a gate G, a source S and a drain D become conductive, and a current passes through these parts. A drain source current IDS is expressed by the following expression:

$$I_{DS} = A \times W/L \text{ (A: a proportionality constant)}.$$

In other words, when a channel width W is smaller and a gate length L is larger, IDS becomes smaller, resulting in a slower operation speed of the transistor.

According to the present embodiment, the channel width W of the pass transistor NP concerning the FS detecting circuit 120 is made intentionally small. When the response speed of the nmos is slow due to intentional reduction in the channel width W, the FS detecting circuit 120 cannot read a value of the CLKD.

However, in the SS state in which the response speed of the nmos is slow, the pulse width of the CLP becomes large and the FS detecting circuit 120 can read the value of the CLKD. In other words, in only the FS state, the FS detecting circuit 120 cannot read the value of the CLKD, and outputs H to the latch 1 in only the FS state.

Figure 10:
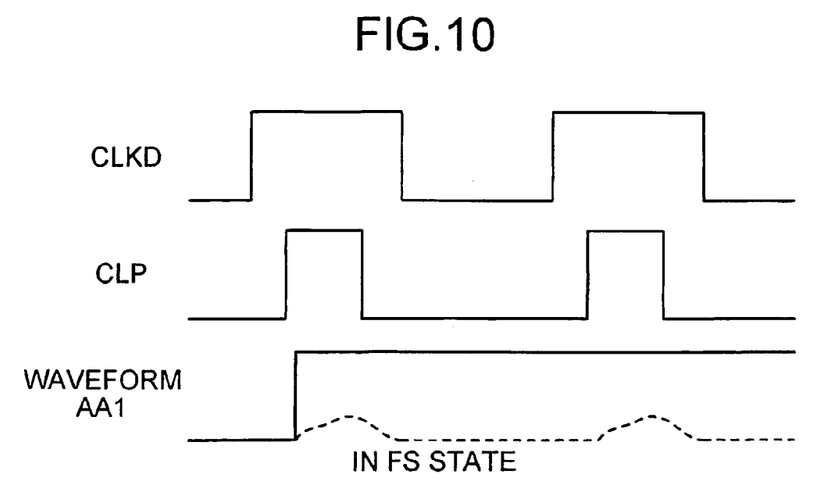
FIG. 10 depicts waveforms of a CLKD and the CLP, and a waveform AA1.

FIG. 10 depicts waveforms of the CLKD and the CLP, and a waveform of a node AA1 (hereinafter, "waveform AA1") concerning each process variation. As shown in this diagram, when the process variation is in a state other than FS state, the waveform AA1 becomes H as indicated by a solid line, when the CLP becomes H. However, when the process variation is in the FS state, the waveform AA1 remains L as indicated by a broken line, even when the CLP becomes H.

The SF detecting circuit 130 is explained next. The SF detecting circuit 130 receives the CLKD and the CLPX from the detecting-circuit pulse-generating circuit 110, and outputs H to the latch 2 only when the process variation is in the SF state.

Figure 11:
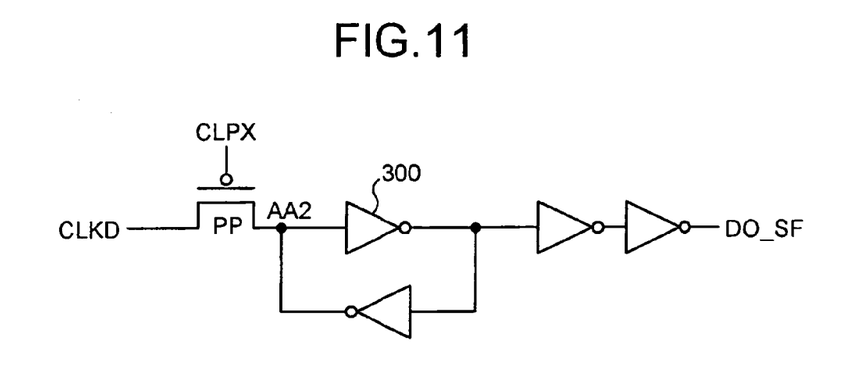
FIG. 11 is one example of a configuration of an SF detecting circuit.

FIG. 11 is one example of a configuration of the SF detecting circuit 130. As shown in this diagram, the SF detecting circuit 130 has a pass transistor PP of the pmos, and a plurality of inverters. The SF detecting circuit 130 according to the present embodiment reads the H value of the CLKD when the CLPX is L.

In order to make it impossible to read the value of the CLKD when the response speed of the pmos is slow, the channel width W of the pass transistor PP concerning the SF detecting circuit 130 is made intentionally small, and the channel width W of the nmos concerning an inverter 300 is made small.

In the SS state in which the response speed of the nmos is slow, the pulse width of the CLPX is large, like with the FS detecting circuit 120. Therefore, the SF detecting circuit 130 can read the value of the CLKD while the ON state of the pass transistor PP lasts. In other words, the SF detecting circuit 130 cannot read the value of the CLKD in only the SF state, and outputs H to the latch 2 in only the SF state.

Figure 12:
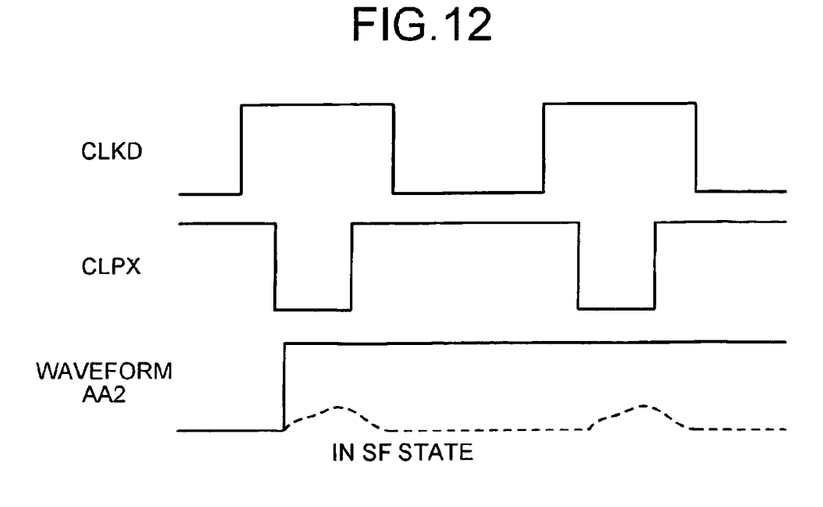
FIG. 12 depicts waveforms of the CLKD and a CLPX, and a waveform AA2.

FIG. 12 depicts waveforms of the CLKD and the CLPX, and a waveform of a node AA2 (hereinafter, a "waveform AA2") concerning each process variation. As shown in this diagram, when the process variation is in a state other than the SF state, the waveform AA2 becomes H as indicated by a solid line, when the CLPX becomes L. However, when the process variation is in the SF state, the waveform AA2 remains L as indicated by a broken line, even when the CLPX becomes L.

The FF detecting circuit 140 is explained next. The FF detecting circuit 140 receives the CLKD, the CLP, and the CLPX, and outputs H to the latch 3 only when the process variation is in the FF state.

Figure 13:
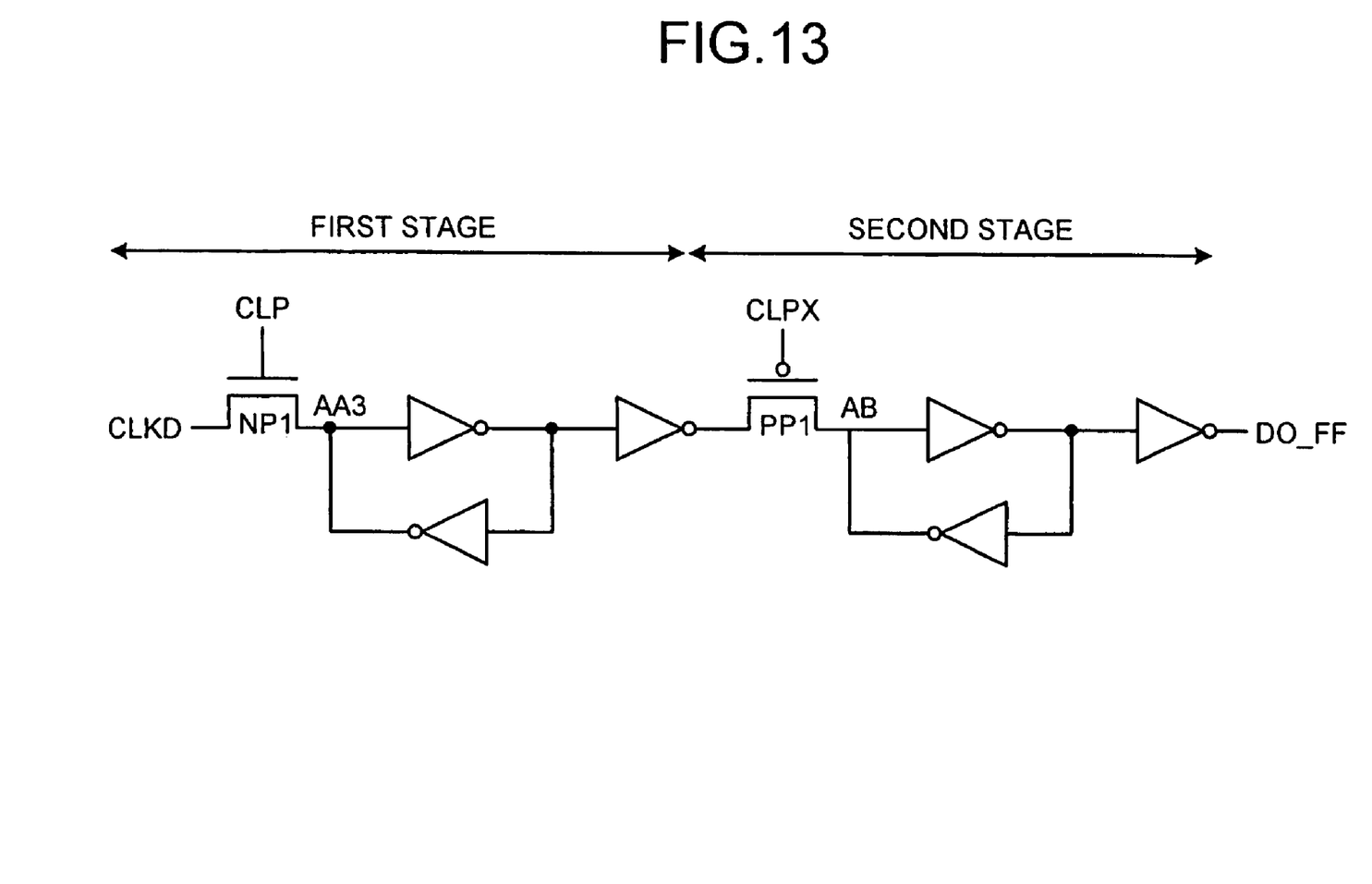
FIG. 13 is one example of a configuration of an FF detecting circuit.

FIG. 13 is one example of a configuration of the FF detecting circuit 140. As shown in this diagram, the FF detecting circuit 140 has a pass transistor NP1 of the nmos, a pass transistor PP1 of the pmos, and a plurality of inverters.

The FF detecting circuit 140 according to the present embodiment reads a signal at a first stage including the pass transistor NP1 and a second stage including the pass transistor PP1. In order to read the value of the CLKD only when the process variation is in the FF state, the channel width W of the pass transistors NP1 and PP1 is made intentionally small.

At the first stage, since the channel width W of the pass transistor NP1 is small, the FF detecting circuit 140 cannot read the H value of the CLKD, when the process variation is in the TT, SS, and FS states. However, in the SF and FF states in which the response speed of the nmos is fast, the circuit can read the value of the CLKD.

At the second stage, since the channel width W of the pass transistor PP1 is small, the FF detecting circuit 140 cannot read the H value of the CLKD in the SF state in which the response speed of the pmos is slow. However, in only the FF state in which the response speed of the pmos is fast, the circuit can read the H value of the CLKD up to the second stage, and outputs H to the latch 3.

Figure 14:
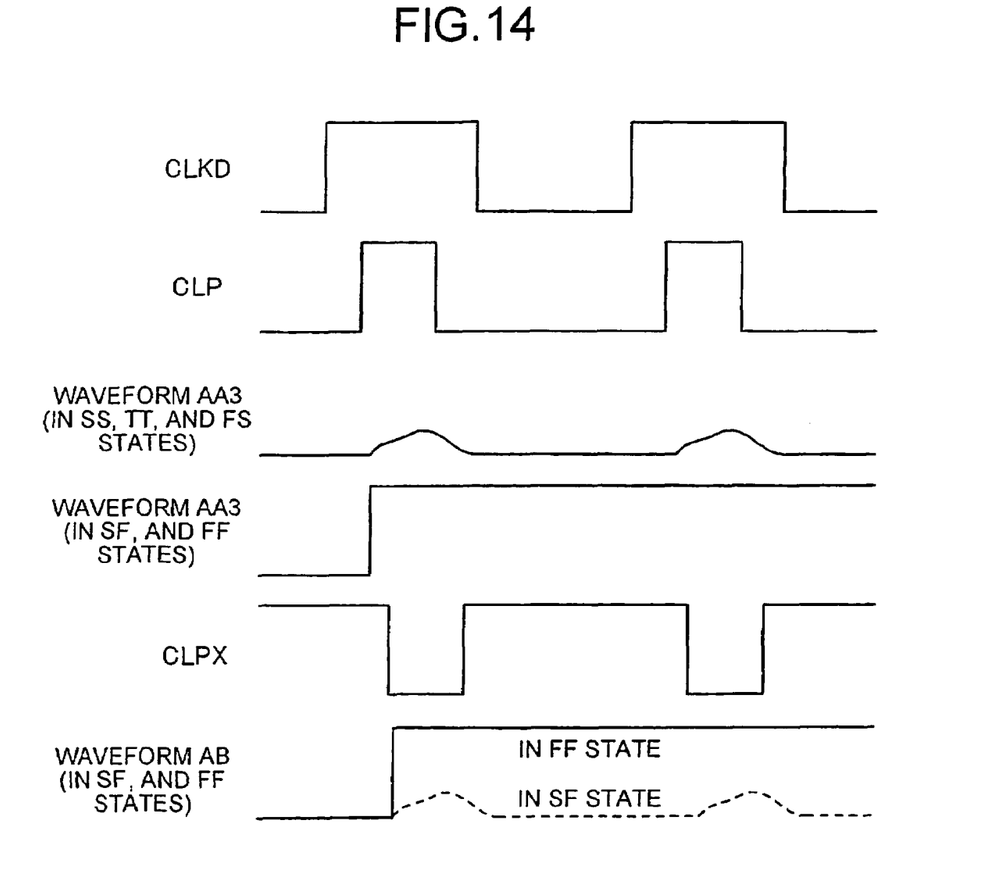
FIG. 14 depicts waveforms of the CLKD, the CLP, and the CLPX, and waveforms AA3 and AB.

FIG. 14 depicts waveforms of the CLKD, the CLP, and the CLPX, a waveform of a node AA3 (hereinafter, "waveform AA3") concerning each process variation, and a waveform of a node AB (hereinafter, a "waveform AB") concerning each process variation. As shown in this diagram, only when the process variation is in the SF and FF states, the waveform AA3 becomes H when the CLP becomes H.

When the process variation is in a state other than the FF state, the waveform AB becomes H as indicated by a solid line, when the CLPX becomes 0. However, when the process variation is in the SF state, the waveform AB remains L as indicated by a broken line, when the CLPX becomes L.

The SS detecting circuit 150 is explained next. The SS detecting circuit 150 receives the CLKD, the CLP1, and the CLPX1 from the detecting-circuit pulse-generating circuit 110, and outputs H to the latch 4 only when the process variation is in the SS state.

Figure 15:
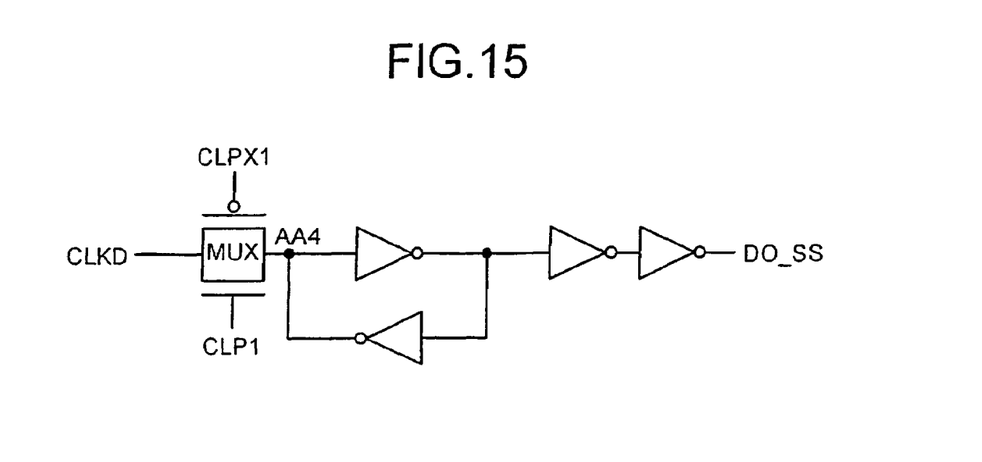
FIG. 15 is one example of a configuration of an SS detecting circuit.

FIG. 15 is one example of a configuration of the SS detecting circuit 150. As shown in this diagram, the SS detecting circuit 150 has a complementary gate MUX, and a plurality of inverters. The SS detecting circuit 150 according to the present embodiment reads the value of the CLKD when the CLP1 is H and when the CLPX is L.

The channel width W of the pmos and the nmos of the complementary gate multiplexer (MUX) (hereinafter, "MUX") is made intentionally small. Further, the CLPX1 and the CLP1 of which pulse width becomes small in the SS state are input to the gate of the MUX, thereby shortening the ON state of the MUX. Therefore, the SS detecting circuit 150 cannot read the value of the CLKD in only the SS state, and outputs H to the latch 4 in only the SS state.

Figure 16:
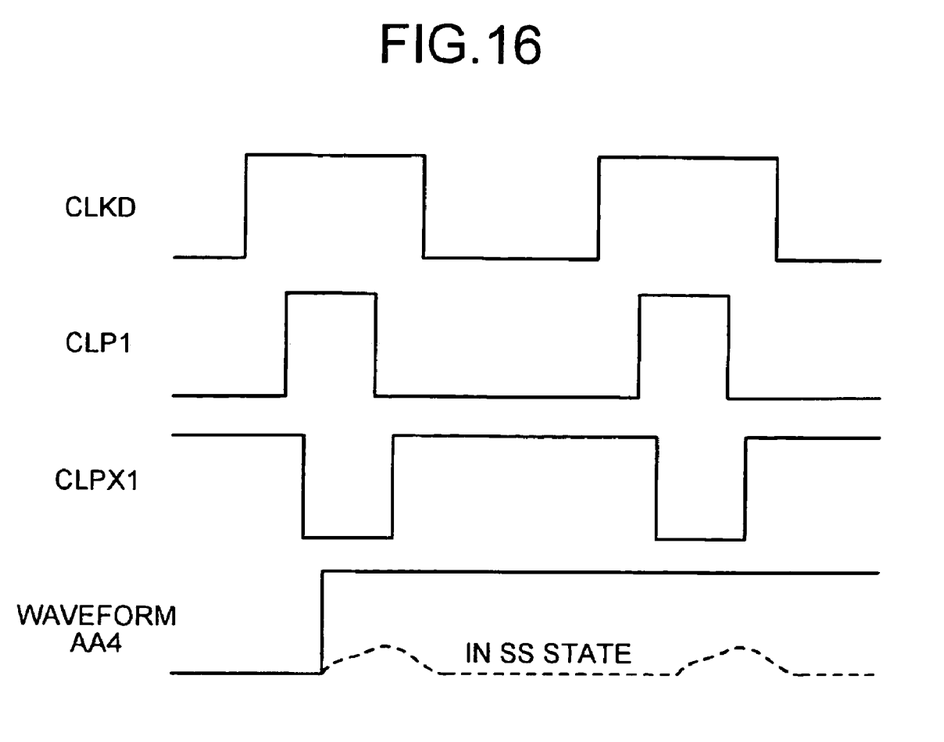
FIG. 16 depicts waveforms of the CLKD, a CLP1, and a CLPX1, and a waveform AA4.

FIG. 16 depicts waveforms of the CLKD, the CLP1, and the CLPX1, and a waveform of a node AA4 (hereinafter, "waveform AA4") concerning each process variation. As shown in this diagram, when the CLP1 is H and when the CLPX1 is L, the waveform AA4 remains L as indicated by a broken line, only when the process variation is in the SS state. The waveform AA4 is H as indicated by a solid line, when the process is in other states.

As described above, the process variation detector 100 according to the present embodiment works as follows. The detecting-circuit pulse-generating circuit 110 generates the clock signal CLK of a pulse width corresponding to each process variation, and outputs the generated signals to the detecting circuits 120 to 150. The FS detecting circuit 120 outputs H to the latch 1 in the FS state. The SF detecting circuit 130 outputs H to the latch 2 in the SF state. The FF detecting circuit 140 outputs H to the latch 3 in the FF state. The SS detecting circuit 150 outputs H to the latch 4 in the SS state. Therefore, the state of a process variation can be understood easily. Further, the values from the outputs 1 to 4 are used as clock tuning signals, which can efficiently cope with a process variation state.

Figure 17:
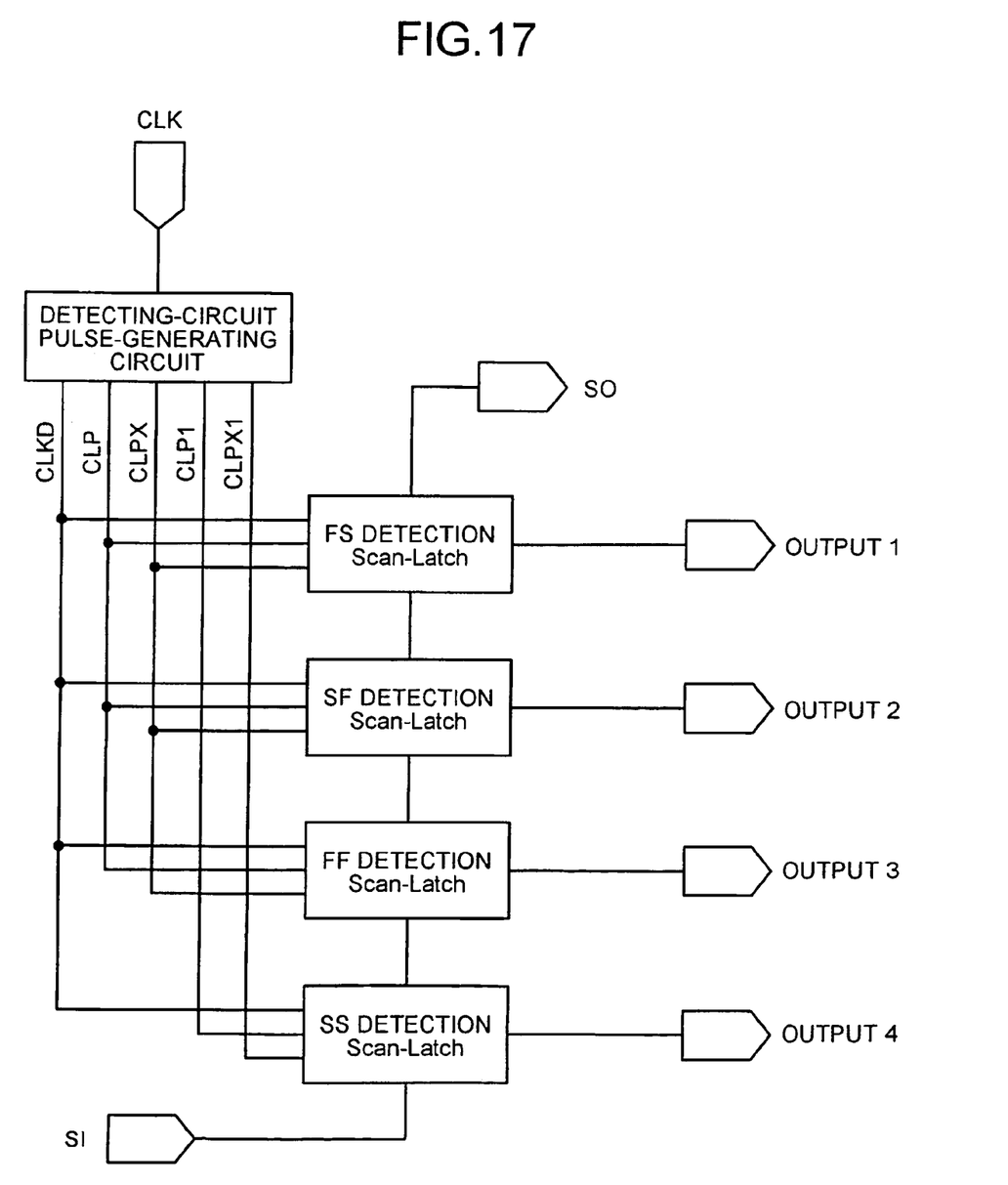
FIG. 17 is one example of a process variation detector that uses scan-latches.

According to the present embodiment, the process variation detector 100 includes the detecting circuits 120 to 150, and the latches 1 to 4, as separate items. However, the configuration is not limited to this. For example, as shown in FIG. 17, each latch can be configured as a scan-latch that can detect each process variation.

According to the present embodiment, the channel width W of each pass transistor is made small as an example, thereby making it possible to detect a state of each process variation. Alternatively, other part concerning the transistor can be set to an unbalance state. With this arrangement, a similar effect can be obtained. For example, instead of setting the channel width W shown in FIG. 9 small, the gate length L can be set large.

According to the present invention, a pulse signal having a pulse width corresponding to a characteristic of a process variation is generated based on a clock signal input from the outside. The pulse signal and a transistor of which a channel width and a gate length are set to an unbalance state are used, thereby outputting a predetermined value only in a state of a specific process variation. Therefore, a state of a process variation can be detected quickly.

According to the present invention, since an output obtained based on a specific process variation is used as a clock tuning signal of a check circuit, a process variation state can be coped with efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A process variation detector that detects process variation in an integrated circuit, the process variation detector comprising:
    a pulse-signal generating unit that generates a pulse signal having a pulse width corresponding to a characteristic of a process variation in an integrated circuit based on a clock signal; and
    an output unit that generates a predetermined value, when the pulse signal indicates a specific process variation, by using a transistor of which a channel width and a gate length are set to an unbalanced state, and outputs the predetermined value.

2. The process variation detector according to claim 1, wherein the process variation detector classifies process variation states into several types of patterns, and includes a plurality of the output unit, each of which corresponds to each of the patterns.

3. The process variation detector according to claim 1, wherein the predetermined value output by the output unit is used as a clock tuning signal of a tuning circuit.

4. A method for detecting process variation in a semiconductor integrated circuit, the method comprising:
    generating a pulse signal having a pulse width corresponding to a characteristic of a process variation in a semiconductor integrated circuit based on a clock signal;
    generating a predetermined value, when the pulse signal indicates a specific process variation, by using a transistor of which a channel width and a gate length are set to an unbalanced state; and
    outputting the predetermined value.

5. The process variation detector according to claim 1, wherein the pulse-signal generator includes
    a series of NOT operators and a NAND operator, the cloak signal branches into a first clock signal and a second clock signal, the first clock signal is input into the NAND operator, the second clock signal is input into the series of NOT operators and then Input Into the NAND operator, and the pulse-signal generator generates the pulse signal based on an output of the NAND operator.

6. The process variation detector according to claim 5, wherein the series of NOT operators includes an odd number of NOT operators.

7. The process variation detector according to claim 6, wherein the series of NOT operators includes nine NOT operators.

8. The process variation detector according to claim 5, wherein the series of NOT operators includes an even number of NOT operators.

9. The process variation detector according to claim 6, wherein the aeries of NOT operators includes six NOT operators.

10. The process variation detector according to claim 1, wherein the pulse width varies according to the process variation.

11. The process variation detector according to claim 10, wherein the transistor Is a complementary gate MUX.

12. The process variation detector according to claim 10, wherein the translator is a mos transistor, and the pulse signal is applied to the mos transistor as a gate voltage.

13. The process variation detector according to claim 12, wherein the mos transistor Is a nmos transistor.

14. The process variation detector according to claim 12, wherein the mos translator is a pmos transistor.

15. The process variation detector according to claim 12, wherein the pulse width of the pulse signal controls a current passes through the mos transistor.

16. The process variation detector according to claim 15, wherein the pulse signal includes a H section having a first pulse width and a L section having a second width, and the pulse width corresponds to the first pulse width or the second pulse width.

17. The process variation detector according to claim 1, wherein the output unit further includes a NOT operator.

* * * * *

UNITED STATES PATENT AND TRADEMARK OFFICE
CERTIFICATE OF CORRECTION

| | | |
|---|---|---|
| PATENT NO. | : 7,155,360 B2 | Page 1 of 1 |
| APPLICATION NO. | : 10/995341 | |
| DATED | : December 26, 2006 | |
| INVENTOR(S) | : Kensuke Shinohara | |

It is certified that error appears in the above-identified patent and that said Letters Patent is hereby corrected as shown below:

Column 8, Line 36, change "claim 6," to --claim 8,--.

Signed and Sealed this

Third Day of April, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,155,360 B2 | Page 1 of 1 |
| APPLICATION NO. | : 10/995341 | |
| DATED | : December 26, 2006 | |
| INVENTOR(S) | : Kensuke Shinohara | |

It is certified that error appears in the above-identified patent and that said Letters Patent is hereby corrected as shown below:

Title Page, Column 1 (*) section, Lines 4-5, Delete "This patent is subject to a terminal disclaimer".

Signed and Sealed this

Tenth Day of April, 2007

JON W. DUDAS
*Director of the United States Patent and Trademark Office*